US012674849B2

(12) United States Patent
Murakami et al.

(10) Patent No.: US 12,674,849 B2
(45) Date of Patent: Jul. 7, 2026

(54) MEASUREMENT APPARATUS AND MEASUREMENT METHOD

(71) Applicants: Yokogawa Electric Corporation, Musashino (JP); Yokogawa Test & Measurement Corporation, Hachioji (JP)

(72) Inventors: Kenji Murakami, Hachioji (JP); Naoki Ito, Hachioji (JP)

(73) Assignees: Yokogawa Electric Corporation, Tokyo (JP); Yokogawa Test & Measurement Corporation, Tokyo (JP)

( * ) Notice: Subject to any disclaimer, the term of this patent is extended or adjusted under 35 U.S.C. 154(b) by 164 days.

(21) Appl. No.: 18/655,776

(22) Filed: May 6, 2024

(65) Prior Publication Data

US 2024/0377477 A1 Nov. 14, 2024

(30) Foreign Application Priority Data

May 10, 2023 (JP) ................................. 2023-078038

(51) Int. Cl.
  *G01R 31/52* (2020.01)
  *G01R 25/00* (2006.01)
(52) U.S. Cl.
  CPC ........... *G01R 31/52* (2020.01); *G01R 25/005* (2013.01)
(58) Field of Classification Search
  None
  See application file for complete search history.

(56) References Cited

U.S. PATENT DOCUMENTS 4,054,832 A * 10/1977 Reynolds ............... G01R 27/18
                                                          324/510
5,514,964 A * 5/1996 Benesh .................. G01R 31/52
                                                          324/509
2023/0020049 A1 1/2023 Wang et al.

FOREIGN PATENT DOCUMENTS

CN       108169700 A    6/2018
JP       H06-27165 A    2/1994
              (Continued)

OTHER PUBLICATIONS

Office Action dated Mar. 11, 2025, issued in counterpart JP Application No. 2023-078038, with English translation. (12 pages).
(Continued)

*Primary Examiner* — Paresh Patel
(74) *Attorney, Agent, or Firm* — WHDA, LLP

(57) ABSTRACT

A phase angle is measured accurately when a resistance component leakage current is measured. A measurement apparatus 10 according to the present disclosure includes a magnetic core 11, first and second coils L1 and L2 wound around the magnetic core 11, a current measurement circuit 12, a voltage measurement circuit 13, a phase angle detection circuit 15, a signal generator 14 that can output sinusoidal waves to the second coil 12 and the phase angle detection circuit 15, and a controller 16. The phase angle detection circuit 15 can detect a calibration phase angle between a current measured by the current measurement circuit 12 when the signal generator 14 is outputting the sinusoidal waves, and one of the sinusoidal waves input from the signal generator 14. The controller 16 calculates a corrected phase angle based on a phase angle and the calibration phase angle, and calculates a resistance component leakage current based on a leakage current and the corrected phase angle.

10 Claims, 5 Drawing Sheets

(56)         References Cited

FOREIGN PATENT DOCUMENTS

| | | | |
|---|---|---|---|
| JP | 2004-325302 | A | 11/2004 |
| JP | 2023-21267 | A | 2/2023 |
| WO | 2008016274 | A1 | 2/2008 |

OTHER PUBLICATIONS

Extended European Search Report dated Oct. 22, 2024, issued in counterpart Application No. 24171951.7. (10 pages).

* cited by examiner

PRIOR ART

MEASUREMENT APPARATUS AND MEASUREMENT METHOD

CROSS-REFERENCE TO RELATED APPLICATION

This application claims priority to Japanese Patent Application No. 2023-078038, filed on May 10, 2023, the entire contents of which are incorporated herein by reference.

TECHNICAL FIELD

The present disclosure relates to a measurement apparatus and a measurement method.

BACKGROUND

Technology for measuring leakage current in live wires is known. The live wires are wires through which current is flowing. The leakage current is also referred to as "Io".

The leakage current has resistance component leakage current and capacitance component leakage current. The resistance component leakage current is also referred to as "Ior". The capacitance component leakage current is also referred to as "Ioc".

The leakage current (Io) is the vector sum of the resistance component leakage current (Ior) and the capacitance component leakage current (Ioc). When θ represents a phase angle between the leakage current of a wire and the voltage of the wire, the resistance component leakage current (Ior) is expressed by the following equation.

$$Ior = Io \times \cos \theta$$

Flowing resistance component leakage current generates heat and thus can cause fires and other problems. Therefore, it is important to measure the resistance component leakage current with high accuracy.

For example, Patent Literature (PTL) 1 discloses a detection apparatus that can measure a resistance component leakage current.

CITATION LIST

Patent Literature

PTL 1: JP 2023-21267 A

SUMMARY

A measurement apparatus according to some embodiments is a measurement apparatus configured to be able to measure a resistance component leakage current, the measurement apparatus including:
- a magnetic core capable of being disposed so as to surround a wire; first and second coils wound around the magnetic core;
- a current measurement circuit connected to the first coil, the current measurement circuit configured to be able to measure a leakage current of the wire;
- a voltage measurement circuit configured to be able to measure a voltage of the wire;
- a phase angle detection circuit configured to be able to detect a phase angle between the leakage current and the voltage;
- a signal generator configured to be able to output sinusoidal waves to the second coil and the phase angle detection circuit; and

- a controller, wherein the phase angle detection circuit is configured to be able to detect a calibration phase angle between a current measured by the current measurement circuit when the signal generator is outputting the sinusoidal waves, and one of the sinusoidal waves input from the signal generator, and the controller is configured to:
- calculate a corrected phase angle based on the phase angle and the calibration phase angle; and
- calculate the resistance component leakage current based on the leakage current and the corrected phase angle.

A measurement method according to some embodiments is a measurement method by a measurement apparatus configured to be able to measure a resistance component leakage current, the measurement apparatus including a magnetic core capable of being disposed so as to surround a wire, first and second coils wound around the magnetic core, a current measurement circuit connected to the first coil, the current measurement circuit configured to be able to measure a leakage current of the wire, a voltage measurement circuit configured to be able to measure a voltage of the wire, a phase angle detection circuit configured to be able to detect a phase angle between the leakage current and the voltage, and a signal generator configured to be able to output sinusoidal waves to the second coil and the phase angle detection circuit, the measurement method including:
- detecting, by the phase angle detection circuit, a calibration phase angle between a current measured by the current measurement circuit when the signal generator is outputting the sinusoidal waves, and one of the sinusoidal waves input from the signal generator;
- calculating a corrected phase angle based on the phase angle and the calibration phase angle; and
- calculating the resistance component leakage current based on the leakage current and the corrected phase angle.

BRIEF DESCRIPTION OF THE DRAWINGS

In the accompanying drawings:

FIG. 1 is a schematic configuration diagram of a measurement apparatus according to an embodiment;

FIG. 4 is a schematic configuration diagram of a measurement apparatus according to a variation.

DETAILED DESCRIPTION

Figure 2:
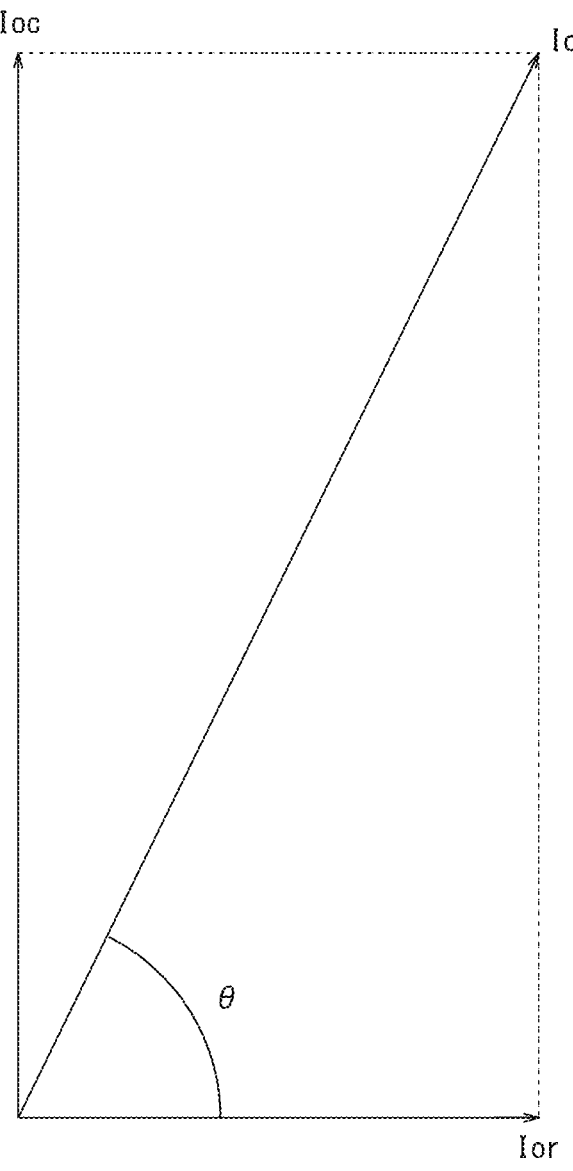
FIG. 2 is a vector diagram illustrating the relationship between a leakage current Io, a resistance component leakage current Ior, and a capacitance component leakage current Ioc.

A resistance component leakage current is calculated based on a leakage current and a phase angle, as in the above equation. Accordingly, in order to measure the resistance component leakage current with high accuracy, it is necessary to measure not only the leakage current accurately but also the phase angle accurately.

In the normal measurement of the leakage current, a phase advance or delay occurs in a magnetic core, a current measurement circuit, and the like for measuring the leakage current. Therefore, it is necessary to adjust or correct the phase advance or delay during manufacturing, maintenance, or the like.

However, the phase advance or delay may significantly vary due to degradation of an apparatus and variations in environmental temperature. Therefore, when the resistance component leakage current is actually measured, the phase advance or delay may vary significantly since the adjustment or correction has been made, making it difficult to measure the phase angle with high accuracy.

It would be helpful to provide a measurement apparatus and a measurement method that can measure a phase angle with high accuracy when a resistance component leakage current is measured.

A measurement apparatus according to some embodiments is a measurement apparatus configured to be able to measure a resistance component leakage current, the measurement apparatus including:

a magnetic core capable of being disposed so as to surround a wire; first and second coils wound around the magnetic core;

a current measurement circuit connected to the first coil, the current measurement circuit configured to be able to measure a leakage current of the wire;

a voltage measurement circuit configured to be able to measure a voltage of the wire;

a phase angle detection circuit configured to be able to detect a phase angle between the leakage current and the voltage;

a signal generator configured to be able to output sinusoidal waves to the second coil and the phase angle detection circuit; and a controller, wherein the phase angle detection circuit is configured to be able to detect a calibration phase angle between a current measured by the current measurement circuit when the signal generator is outputting the sinusoidal waves, and one of the sinusoidal waves input from the signal generator, and the controller is configured to:

calculate a corrected phase angle based on the phase angle and the calibration phase angle; and calculate the resistance component leakage current based on the leakage current and the corrected phase angle. Such a measurement apparatus can measure the phase angle with high accuracy when measuring the resistance component leakage current.

In the measurement apparatus according to an embodiment, the controller is configured to calculate the corrected phase angle based on the following equation (1):

$$\theta = \theta 1 - \theta 2 \qquad (1)$$

wherein, $\theta$ represents the corrected phase angle, $\theta 1$ represents the phase angle, and $\theta 2$ represents the calibration phase angle. This allows calculation of the corrected phase angle.

In the measurement apparatus according to an embodiment, the controller is configured to calculate the resistance component leakage current based on the following equation (2):

$$Ior = Io \times \cos\theta \qquad (2)$$

wherein, Ior represents the resistance component leakage current, and Io represents the leakage current. This allows calculation of the resistance component leakage current.

The measurement apparatus according to an embodiment may further include an input interface configured to be able to accept an operation from a user, wherein when the input interface accepts, from the user, the operation to start a calibration operation, the controller may control the signal generator to output the sinusoidal waves and may detect the calibration phase angle. This allows the calibration operation to be started in response to the operation from the user.

The measurement apparatus according to an embodiment may further include a display, wherein the controller may be configured to control the display to display the calculated resistance component leakage current. This allows the user to check the resistance component leakage current by display on the display.

In the measurement apparatus according to an embodiment, the signal generator may be configured to output the sinusoidal waves at one or more frequencies different from a measurement target frequency of the resistance component leakage current, and the controller may be configured to perform detection of the calibration phase angle and calculation of the resistance component leakage current simultaneously. This allows the calibration operation and a measurement operation to be performed simultaneously.

In the measurement apparatus according to an embodiment, the signal generator may be configured to output the sinusoidal waves at one frequency different from the measurement target frequency of the resistance component leakage current, and the controller may be configured to calculate the calibration phase angle at the measurement target frequency of the resistance component leakage current, based on the calibration phase angle detected when the signal generator is outputting the sinusoidal waves at the one frequency different from the measurement target frequency of the resistance component leakage current. This allows the calibration operation and the measurement operation to be performed simultaneously.

In the measurement apparatus according to an embodiment, the signal generator may be configured to output the sinusoidal waves at two frequencies different from the measurement target frequency of the resistance component leakage current, and the controller may be configured to calculate the calibration phase angle at the measurement target frequency of the resistance component leakage current, based on the calibration phase angle detected when the signal generator is outputting the sinusoidal waves at the two frequencies different from the measurement target frequency of the resistance component leakage current. This allows the calibration operation and the measurement operation to be performed simultaneously.

In the measurement apparatus according to an embodiment, one of the two frequencies may be higher than the measurement target frequency, and the other of the two frequencies may be lower than the measurement target frequency. This allows calculation of the calibration phase angle with high accuracy.

A measurement method according to some embodiments is a measurement method by a measurement apparatus configured to be able to measure a resistance component leakage current, the measurement apparatus including a magnetic core capable of being disposed so as to surround a wire, first and second coils wound around the magnetic core, a current measurement circuit connected to the first coil, the current measurement circuit configured to be able to measure a leakage current of the wire, a voltage measurement circuit configured to be able to measure a voltage of the wire, a phase angle detection circuit configured to be able to detect a phase angle between the leakage current and the voltage, and a signal generator configured to be able to output sinusoidal waves to the second coil and the phase angle detection circuit, the measurement method including:

detecting, by the phase angle detection circuit, a calibration phase angle between a current measured by the current measurement circuit when the signal generator is outputting the sinusoidal waves, and one of the sinusoidal waves input from the signal generator;

calculating a corrected phase angle based on the phase angle and the calibration phase angle; and calculating the resistance component leakage current based on the leakage current and the corrected phase angle. Such a measurement method can measure the phase angle with high accuracy when measuring the resistance component leakage current.

According to the present disclosure, it is possible to provide a measurement apparatus and a measurement method that can measure a phase angle with high accuracy when a resistance component leakage current is measured.

An embodiment of the present disclosure will be described below with reference to the drawings.

Figure 1:
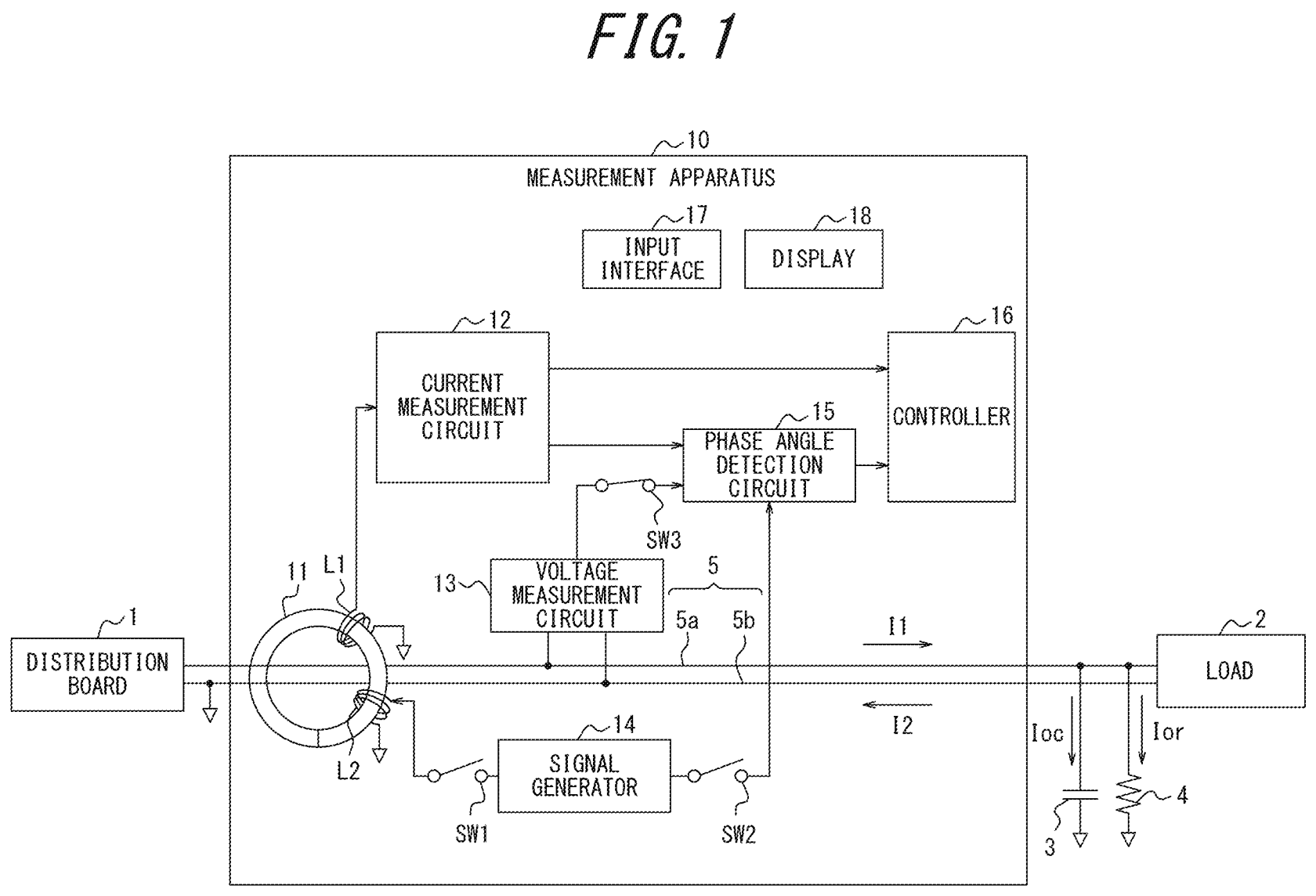

FIG. 1 is a schematic configuration diagram of a measurement apparatus 10 according to the embodiment.

The measurement apparatus 10 is an apparatus that can measure a resistance component leakage current of a live wire. FIG. 1 illustrates how the measurement apparatus 10 measures a resistance component leakage current of a wire 5 connecting between a distribution board 1 and a load 2. The wire 5 is a wire through which current is flowing, and thus is a live wire 5.

FIG. 1 illustrates, as an example, the measurement apparatus 10 that is measuring the resistance component leakage current of the wire 5 connecting between the distribution board 1 to the load 2. The measurement apparatus 10 can measure a resistance component leakage current of any live wire, not limited to the wire 5.

The wire 5 has a signal line 5a and a ground line 5b. The wire 5 may be, for example, a coaxial cable in which the ground line 5b is wound around the signal line 5a.

In the example illustrated in FIG. 1, a current I1 flows through the signal line 5a from the distribution board 1 to the load 2. Also, a current I2 flows through the ground line 5b from the load 2 to the distribution board 1. When no leakage current flows from the wire 5, the currents I1 and I2 are equal.

When a leakage current flows from the wire 5, the leakage current Io is a difference between the current I1 and the current I2, and is expressed by the following equation (1).

$$Io = I1 - I2 \qquad (1)$$

The leakage current Io is the vector sum of a resistance component leakage current Ior flowing from the signal line 5a of the wire 5 to the ground through a resistor 4 and a capacitance component leakage current Ioc flowing from the signal line 5a of the wire 5 to the ground through a capacitor 3.

The resistor 4 illustrated in FIG. 1 is not an image of a resistance element, but of a resistance component through which the resistance component leakage current Ior flows. The capacitor 3 illustrated in FIG. 1 is not an image of a capacitor element, but of a capacitance component through which the capacitance component leakage current Ioc flows.

FIG. 2 is a vector diagram illustrating the relationship between the leakage current Io, the resistance component leakage current Ior, and the capacitance component leakage current Ioc. In FIG. 2, $\theta$ is a phase angle between the leakage current Io flowing through the wire 5 and the voltage of the wire 5. In this embodiment, "the voltage of the wire 5" means a difference between the voltage of the signal line 5a and the voltage of the ground line 5b.

As illustrated in FIG. 2, the resistance component leakage current Ior is expressed by the following equation (2) based on the leakage current Io and the phase angle $\theta$.

$$Ior = Io \times \cos\theta \qquad (2)$$

With reference again to FIG. 1, the outline of the configuration and functions of the measurement apparatus 10 will be described.

The measurement apparatus 10 has a magnetic core 11, a first coil L1, a second coil L2, a current measurement circuit 12, a voltage measurement circuit 13, a signal generator 14, a phase angle detection circuit 15, a controller 16, an input interface 17, a display 18, a first switch SW1, a second switch SW2, a third switch SW3.

The magnetic core 11 can be disposed so as to surround the wire 5, which is a target of measurement of the resistance component leakage current. The magnetic core 11 may be in the shape of a ring, for example. The magnetic core 11 may be partially openable and closable. When the magnetic core 11 is partially openable and closeable, the magnetic core 11 can catch the wire 5.

The first coil L1 is a coil wound around the magnetic core 11. The first coil L1 can detect a leakage current of the wire 5 caught by the magnetic core 11.

The second coil L2 is a coil wound around the magnetic core 11. The second coil L2 is a coil used in a calibration operation in the measurement apparatus 10.

When a sinusoidal wave is input from the signal generator 14 to the second coil L2 during the calibration operation, a sinusoidal current flows through the second coil L2. The second coil L2 then generates, inside the magnetic core 11, a magnetic flux in response to the sinusoidal wave. Then, a current flows through the first coil L1, and the first coil L1 detects the current corresponding to the sinusoidal wave.

The current measurement circuit 12 is connected to the first coil L1. To the current measurement circuit 12, the leakage current of the wire 5 detected by the first coil L1 is input. The current measurement circuit 12 can thereby measure the leakage current of the wire 5.

The current measurement circuit 12 may include a current-to-voltage conversion circuit, an amplification circuit, and the like. The current measurement circuit 12 outputs a signal corresponding to the measured leakage current of the wire 5 to the phase angle detection circuit 15 and the controller 16. The current measurement circuit 12 may output the signal corresponding to the measured leakage current of the wire 5, as a current or as a voltage.

The voltage measurement circuit 13 can be connected to the signal line 5a and the ground line 5b of the wire 5. The voltage measurement circuit 13 measures, as the voltage of the wire 5, the difference between the voltage of the signal line 5a and the voltage of the ground line 5b. The voltage measurement circuit 13 may include a differential amplifier circuit or the like. The voltage measurement circuit 13 outputs a signal corresponding to the measured voltage of the wire 5 to the phase angle detection circuit 15 via the third switch SW3.

The signal generator 14 is a signal generator of any configuration that can output two synchronized sinusoidal waves. The signal generator 14 is connected to the second coil L2 via the first switch SW1. The signal generator 14 is connected to the phase angle detection circuit 15 via the second switch SW2.

The signal generator 14 outputs synchronized sinusoidal waves to the second coil L2 and the phase angle detection circuit 15 during the calibration operation in the measurement apparatus 10.

The phase angle detection circuit 15 is a circuit that can detect a phase angle between two input signals.

When the measurement apparatus 10 performs a measurement operation, the phase angle detection circuit 15 detects a phase angle between the leakage current measured by the current measurement circuit 12 and the voltage measured by the voltage measurement circuit 13. The phase angle detection circuit 15 outputs the detected phase angle to the controller 16.

When the measurement apparatus 10 performs the calibration operation, the phase angle detection circuit 15 detects a phase angle for calibration between a current measured by the current measurement circuit 12 when the signal generator 14 is outputting the sinusoidal waves, and the sinusoidal wave input from the signal generator 14. In this embodiment, the phase angle between the current measured by the current measurement circuit 12 when the signal generator 14 is outputting the sinusoidal waves, and the sinusoidal wave input from the signal generator 14 may be referred to as "calibration phase angle". The phase angle detection circuit 15 outputs the detected calibration phase angle to the controller 16.

The controller 16 controls the entire measurement apparatus 10 and each block of the measurement apparatus 10. The controller 16 includes at least one processor, at least one dedicated circuit, or a combination thereof. The processor is a general purpose processor, such as a central processing unit (CPU) or a graphics processing unit (GPU), or a dedicated processor specialized for particular processing. The dedicated circuit is, for example, a field-programmable gate array (FPGA) or an application specific integrated circuit (ASIC).

The details of operations of the controller 16 will be described below.

The input interface 17 includes an interface that can accept operations from a user. The input interface 17 may include, for example, buttons or the like.

The display 18 can display various types of data. The display 18 may include, for example, a liquid crystal display (LCD), an organic electroluminescent (EL) display, or the like.

The first switch SW1 is connected between the signal generator 14 and the second coil L2. The first switch SW1 can turn on/off the connection between the signal generator 14 and the second coil L2 according to a command of the controller 16. The first switch SW1 may be a switch of any configuration capable of switching the electrical connection on and off.

The second switch SW2 is connected between the signal generator 14 and the phase angle detection circuit 15. The second switch SW2 can turn on/off the connection between the signal generator 14 and the phase angle detection circuit 15 according to a command of the controller 16. The second switch SW2 may be a switch of any configuration capable of switching the electrical connection on and off.

The third switch SW3 is connected between the voltage measurement circuit 13 and the phase angle detection circuit 15. The third switch SW3 can turn on/off the connection between the voltage measurement circuit 13 and the phase angle detection circuit 15 according to a command of the controller 16. The third switch SW3 may be a switch of any configuration capable of switching the electrical connection on and off.

(Operation of Measurement Apparatus)

The measurement apparatus 10 performs the calibration operation and the measurement operation when measuring a resistance component leakage current. The calibration operation and the measurement operation will be described in turn.

<Calibration Operation>

First, the calibration operation of the measurement apparatus 10 will be described. By performing the calibration operation immediately before performing the measurement operation, the measurement apparatus 10 can correct a phase advance or delay caused by the magnetic core 11, the first coil L1, and the current measurement circuit 12.

Figure 3:
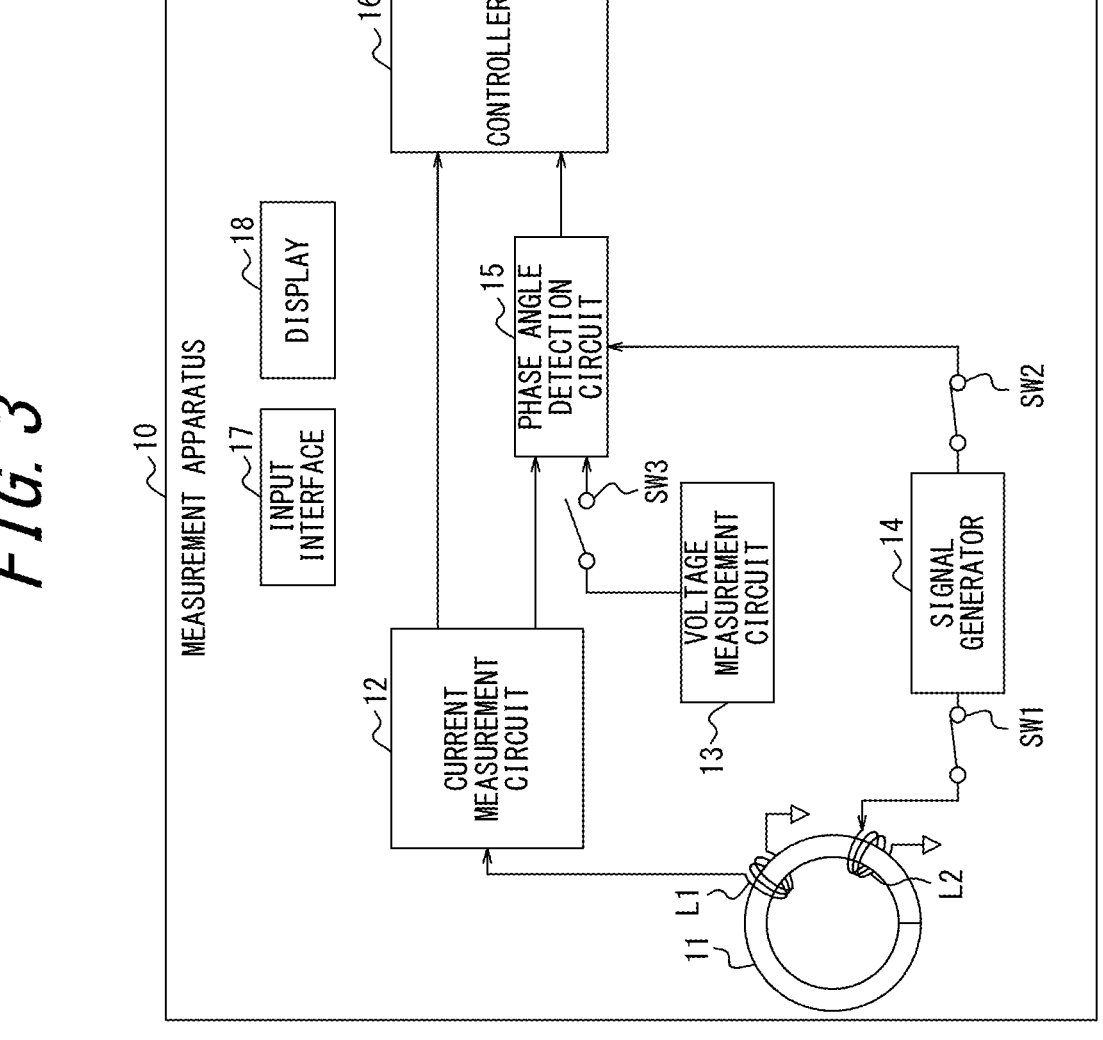
FIG. 3 is a diagram illustrating the measurement apparatus according to the embodiment during a calibration operation.

FIG. 3 is a diagram illustrating the measurement apparatus 10 during the calibration operation. In the calibration operation, the magnetic core 11 does not catch the wire 5. Therefore, FIG. 3 does not illustrate the distribution board 1, the wire 5, the load 2, the capacitor 3, and the resistor 4.

The input interface 17 can accept, from the user, an operation to start the calibration operation. The controller 16 starts the calibration operation when the input interface 17 accepts, from the user, the operation to start the calibration operation.

When the calibration operation starts, the controller 16 turns on the first switch SW1 and the second switch SW2. The controller 16 also turns off the third switch SW3.

The controller 16 then controls the signal generator 14 to generate two synchronized sinusoidal waves. The signal generator 14 outputs one of the sinusoidal waves to the second coil L2 via the first switch SW1. The signal generator 14 also outputs the other of the sinusoidal waves to the phase angle detection circuit 15 via the second switch SW2.

The frequency of the sinusoidal waves output by the signal generator 14 may be the same as a measurement target frequency of the resistance component leakage current. For example, when the measurement target frequency is 50 Hz, the frequency of the sinusoidal waves output by the signal generator 14 may be 50 Hz. For example, when the measurement target frequency is 60 Hz, the frequency of the sinusoidal waves output by the signal generator 14 may be 60 Hz.

When one of the sinusoidal waves is input to the second coil L2 from the signal generator 14, the first coil L1 detects a current corresponding to the sinusoidal wave input to the second coil L2. The current measurement circuit 12 measures a current flowing through the first coil L1, and outputs a signal corresponding to the measured current to the phase angle detection circuit 15.

The phase angle detection circuit 15 detects a calibration phase angle between the current measured by the current measurement circuit 12 when the signal generator 14 is outputting the sinusoidal waves, and the sinusoidal wave input from the signal generator 14. The calibration phase angle detected by the phase angle detection circuit 15 is a phase angle caused by the magnetic core 11, the first coil L1, and the current measurement circuit 12.

The phase angle detection circuit 15 outputs the detected calibration phase angle to the controller 16. The controller 16 holds the calibration phase angle.

<Measurement Operation>

The measurement operation of the measurement apparatus 10 will be subsequently described. After the calibration operation is completed and the controller 16 holds the calibration phase angle, the measurement apparatus 10 can perform the measurement operation.

FIG. 1 is a diagram illustrating the measurement apparatus 10 during the measurement operation. In the measurement operation, the magnetic core 11 is catching the wire 5, which is a target of measurement of the resistance component leakage current. At this time, a current is flowing through the wire 5, so the wire 5 is a live wire.

When the measurement operation is started, the controller 16 turns off the first switch SW1 and the second switch SW2. The controller 16 turns on the third switch SW3. At this time, the controller 16 controls the signal generator 14 to output no sinusoidal waves.

The first coil L1 detects a leakage current of the wire 5 caught by the magnetic core 11. To the current measurement circuit 12, the leakage current of the wire 5 detected by the first coil L1 is input. The current measurement circuit 12 thereby measures the leakage current of the wire 5. The current measurement circuit 12 outputs a signal corresponding to the measured leakage current to the phase angle detection circuit 15.

The voltage measurement circuit 13 measures, as the voltage of the wire 5, a difference between the voltage of the signal line 5a and the voltage of the ground line 5b. The voltage measurement circuit 13 outputs a signal corresponding to the measured voltage of the wire 5 to the phase angle detection circuit 15 via the third switch SW3.

The phase angle detection circuit 15 detects a phase angle between the leakage current measured by the current measurement circuit 12 and the voltage of the wire 5 measured by the voltage measurement circuit 13.

The phase angle detection circuit 15 outputs the detected phase angle to the controller 16.

The controller 16 calculates a corrected phase angle $\theta$, as in the following equation (3), based on the phase angle $\theta 1$ acquired from the phase angle detection circuit 15 in the measurement operation and the calibration phase angle $\theta 2$ acquired from the phase angle detection circuit 15 in the calibration operation.

$$\theta = \theta 1 - \theta 2 \qquad (3)$$

As described above, by correcting the phase angle $\theta 1$ acquired in the measurement operation based on the calibration phase angle $\theta 2$ acquired in the calibration operation, the controller 16 can calculate the corrected phase angle $\theta$ that corrects the phase advance or delay caused by the magnetic core 11, the first coil L1, and the current measurement circuit 12.

The controller 16 calculates a resistance component leakage current Ior, as in the following equation (4), based on the leakage current Io measured by the current measurement circuit 12 and the corrected phase angle $\theta$ calculated by the above equation (3).

$$Ior = Io \times \cos\theta \qquad (4)$$

The controller 16 displays the calculated resistance component leakage current Ior on the display 18.

As described above, the measurement apparatus 10 according to the embodiment can measure a phase angle with high accuracy when measuring a resistance component leakage current. More specifically, the measurement apparatus 10 includes the signal generator 14 that can output sinusoidal waves to the second coil L2 and the phase angle detection circuit 15, and the phase angle detection circuit 15 can detect a calibration phase angle between a current measured by the current measurement circuit 12 when the signal generator 14 is outputting the sinusoidal waves, and the sinusoidal wave input from the signal generator 14. The controller 16 then calculates a corrected phase angle based on a phase angle between a leakage current and a voltage and the calibration phase angle, and calculates a resistance component leakage current based on the leakage current and the corrected phase angle. Thus, by detecting the calibration phase angle and calculating the corrected phase angle based on the phase angle and the calibration phase angle, the measurement apparatus 10 can calculate the corrected phase angle that corrects a phase advance or delay caused by the magnetic core 11, the first coil L1, and the current measurement circuit 12. Therefore, the measurement apparatus 10 can measure the phase angle with high accuracy when measuring the resistance component leakage current.

The measurement apparatus 10 according to the embodiment eliminates the need for adjusting or correcting a phase advance or delay during maintenance or other operations because a calibration phase angle can be calculated automatically. Therefore, a burden on an operator can be reduced.

In addition, it is unnecessary to set up equipment for calibration.

(Variation)

Figure 4:
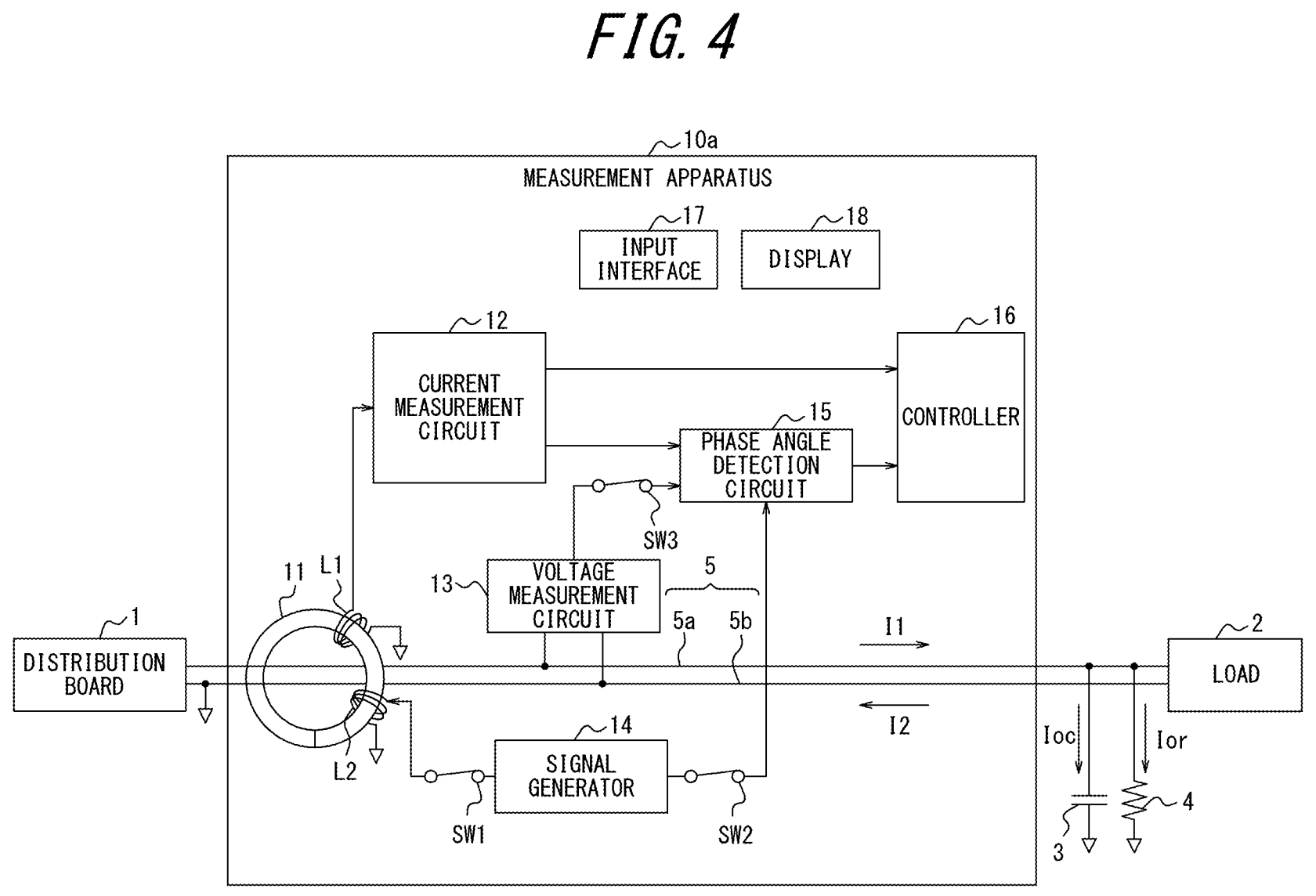

FIG. 4 is a diagram illustrating the schematic configuration of a measurement apparatus 10a according to a variation. The measurement apparatus 10a according to the variation will be described with reference to FIG. 4.

The measurement apparatus 10a according to the variation operates differently from the measurement apparatus 10 illustrated in FIG. 1 in that the calibration operation and the measurement operation are performed simultaneously.

Since the configuration of the measurement apparatus 10a according to the variation is the same as that of the measurement apparatus 10 illustrated in FIG. 1, a description of the configuration of the measurement apparatus 10a is omitted.

The measurement apparatus 10a according to the variation performs the calibration operation and the measurement operation simultaneously. Therefore, the measurement apparatus 10a according to the variation operates with all of the first switch SW1, the second switch SW2, and the third switch SW3 turned on, as illustrated in FIG. 4.

Since the measurement apparatus 10a operates with all of the first switch SW1, the second switch SW2, and the third switch SW3 turned on, the measurement apparatus 10a according to the variation may not include the first switch SW1, the second switch SW2, and the third switch SW3. In this case, the first switch SW1, the second switch SW2, and the third switch SW3 may be shorted.

The signal generator 14 of the measurement apparatus 10a according to the variation outputs sinusoidal waves of a frequency different from a measurement target frequency of a resistance component leakage current. For example, when the measurement target frequency of the resistance component leakage current is 50 Hz, the signal generator 14 outputs the sinusoidal waves at a frequency different from 50 Hz.

Thus, by setting the measurement target frequency of the resistance component leakage current and the frequency of the sinusoidal waves output by the signal generator 14 to be different, the measurement apparatus 10a can perform the calibration operation and the measurement operation simultaneously.

In the following description, Freq_meas represents the measurement target frequency, and Freq_cal represents the frequency of the sinusoidal waves for the calibration operation output by the signal generator 14.

The phase angle detection circuit 15 detects, as a calibration frequency phase angle, a phase angle between a current at a frequency of Freq_cal measured by the current measurement circuit 12 and the sinusoidal wave at the frequency of Freq_cal input from the signal generator 14.

The phase angle detection circuit 15 outputs the detected calibration frequency phase angle to the controller 16.

The controller 16 calculates a calibration phase angle θ2 based on the calibration frequency phase angle $\theta_{cal}$ acquired from the phase angle detection circuit 15, as in the following equation (5).

[Math. 1]

$$\theta2 = \frac{1}{\frac{1}{\theta_{cal}} \times \frac{\text{Freq\_meas}}{\text{Freq\_cal}}} \quad (5)$$

The phase angle detection circuit 15 also detects a phase angle θ1 between a leakage current at a frequency of Freq_meas measured by the current measurement circuit 12 and a voltage at the frequency of Freq_meas in the wire 5 measured by the voltage measurement circuit 13.

The phase angle detection circuit 15 outputs the detected phase angle θ1 to the controller 16.

The controller 16 calculates, as in the above equation (3), a corrected phase angle θ based on the phase angle θ1 acquired from the phase angle detection circuit 15 and the calibration phase angle θ2 calculated based on the above equation (5).

The signal generator 14 of the measurement apparatus 10a according to the variation may output sinusoidal waves at one frequency different from the measurement target frequency of the resistance component leakage current as described above, or may output sinusoidal waves at two frequencies different from the measurement target frequency of the resistance component leakage current. Operations when the signal generator 14 outputs sinusoidal waves at two frequencies different from the measurement target frequency of the resistance component leakage current will be hereinafter described.

In the following description, Freq_cal1 represents one of the frequencies of the sinusoidal waves for the calibration operation output by the signal generator 14, and Freq_cal2 represents the other of the frequencies of the sinusoidal waves for the calibration operation output by the signal generator 14. Freq_cal1 is a frequency lower than Freq_meas, and Freq_cal2 is a frequency higher than Freq_meas.

The phase angle detection circuit 15 detects, as a first calibration frequency phase angle, a phase angle between a current at a frequency of Freq_cal1 measured by the current measurement circuit 12 and the sinusoidal wave at the frequency of Freq_cal1 input from the signal generator 14.

The phase angle detection circuit 15 detects, as a second calibration frequency phase angle, a phase angle between a current at a frequency of Freq_cal2 measured by the current measurement circuit 12 and the sinusoidal wave at the frequency of Freq_cal2 input from the signal generator 14.

The phase angle detection circuit 15 outputs the detected first and second calibration frequency phase angles to the controller 16.

The controller 16 calculates a calibration phase angle θ2 based on the first calibration frequency phase angle $\theta_{cal1}$ and the second calibration frequency phase angle $\theta_{cal2}$ acquired from the phase angle detection circuit 15, as in equations (6) to (8) below.

[Math. 2]

$$A = \frac{\frac{1}{\theta_{cal2}} - \frac{1}{\theta_{cal1}}}{\text{Freq\_cal2} - \text{Freq\_cal1}} \quad (6)$$

[Math. 3]

$$B = \frac{1}{\theta_{cal1}} - A \times \text{Freq\_cal1} \quad (7)$$

[Math. 4]

$$\theta2 = \frac{1}{A \times \text{Freq\_meas} + B} \quad (8)$$

The phase angle detection circuit 15 also detects a phase angle θ1 between a leakage current at a frequency of Freq_meas measured by the current measurement circuit 12 and a voltage at the frequency of Freq_meas in the wire 5 measured by the voltage measurement circuit 13.

The phase angle detection circuit 15 outputs the detected phase angle θ1 to the controller 16.

The controller 16 calculates, as in the above equation (3), a corrected phase angle θ based on the phase angle θ1 acquired from the phase angle detection circuit 15 and the calibration phase angle θ2 calculated based on the equations (6) to (8) above.

As described above, since the signal generator 14 outputs sinusoidal waves at two frequencies different from a measurement target frequency, the measurement apparatus 10a according to the variation can calculate a corrected phase angle θ with high accuracy over a wide frequency range, compared to a case in which the signal generator 14 outputs the sinusoidal waves at one frequency different from the measurement target frequency.

Comparative Example

Figure 5:
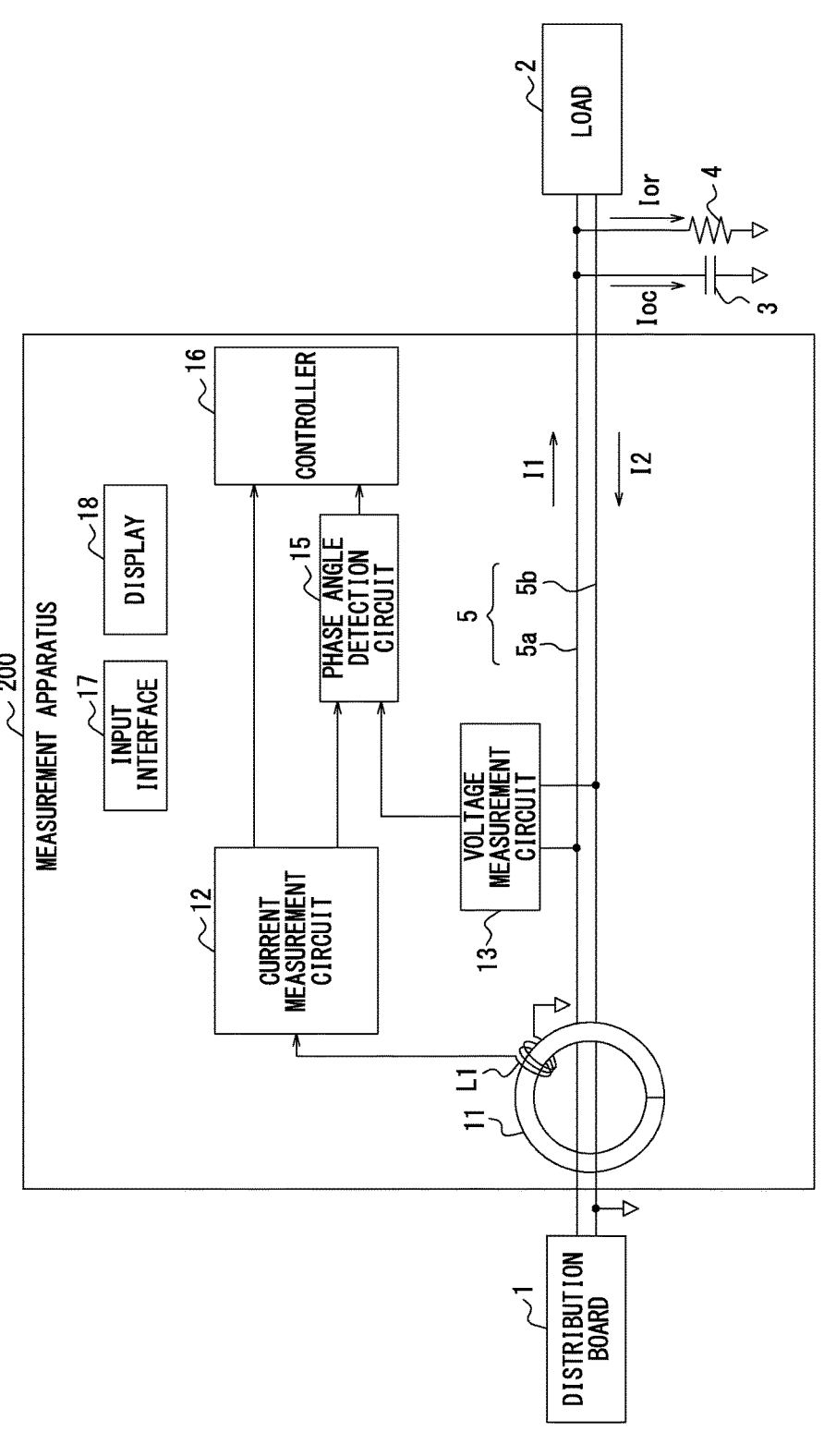
FIG. 5 is a schematic configuration diagram of a measurement apparatus according to a comparative example.

FIG. 5 is a schematic configuration diagram of a measurement apparatus 200 according to a comparative example.

The measurement apparatus 200 according to the comparative example includes a magnetic core 11, a first coil L1, a current measurement circuit 12, a voltage measurement circuit 13, a phase angle detection circuit 15, a controller 16, an input interface 17, and a display 18.

The measurement apparatus 200 according to the comparative example differs from the measurement apparatus 10 according to the embodiment illustrated in FIG. 1 in that the measurement apparatus 200 does not have the second coil L2, the signal generator 14, the first switch SW1, the second switch SW2, and the third switch SW3.

The measurement apparatus 200 according to the comparative example does not have the second coil L2 and the signal generator 14, and therefore cannot perform the calibration operation, which the measurement apparatus 10 illustrated in FIG. 1 can perform.

Therefore, the measurement apparatus 200 according to the comparative example cannot correct a phase advance or delay caused by the magnetic core 11, the first coil L1, and the current measurement circuit 12 by the calibration operation. Therefore, the measurement apparatus 200 according to the comparative example cannot measure a phase angle with high accuracy when measuring a resistance component leakage current.

It is obvious to a person skilled in the art that the present disclosure can be realized in predetermined forms other than the embodiment described above without departing from its spirit or its essential features. Accordingly, the preceding description is illustrative and not limiting. The scope of the disclosure is defined by the appended claims, not by the preceding description. Among all modifications, some modifications that are within the scope of equivalents are encompassed therein.

For example, the disposition, number, and the like of each of the components described above are not limited to those illustrated in the above description and drawings. The disposition, number, and the like of each of the components may be arbitrarily configured as long as the function thereof can be realized.

For example, the above embodiment describes the measurement apparatus 10 that can correct a phase angle when measuring a resistance component leakage current. However, the above technology for correcting a phase angle can also be applied to other apparatuses that measure a phase angle. For example, it is important for clamp power meters to measure a phase angle with high accuracy, and the above technology for correcting a phase angle is also applicable to the clamp power meters. When the above technology for correcting a phase angle is implemented in a clamp power meter, the clamp power meter can measure a phase angle with high accuracy, and therefore can perform power measurement with high accuracy.

The invention claimed is:

1. A measurement apparatus configured to be able to measure a resistance component leakage current, the measurement apparatus comprising:

a magnetic core capable of being disposed so as to surround a wire;

first and second coils wound around the magnetic core;

a current measurement circuit connected to the first coil, the current measurement circuit configured to be able to measure a leakage current of the wire;

a voltage measurement circuit configured to be able to measure a voltage of the wire;

a phase angle detection circuit configured to be able to detect a phase angle between the leakage current and the voltage;

a signal generator configured to be able to output sinusoidal waves to the second coil and the phase angle detection circuit; and a controller, wherein the phase angle detection circuit is configured to be able to detect a calibration phase angle between a current measured by the current measurement circuit when the signal generator is outputting the sinusoidal waves, and one of the sinusoidal waves input from the signal generator, and the controller is configured to:

calculate a corrected phase angle based on the phase angle and the calibration phase angle; and calculate the resistance component leakage current based on the leakage current and the corrected phase angle.

2. The measurement apparatus according to claim 1, wherein the controller is configured to calculate the corrected phase angle based on a following equation (1):

$$\theta = \theta 1 - \theta 2 \tag{1}$$

wherein, $\theta$ represents the corrected phase angle, $\theta 1$ represents the phase angle, and $\theta 2$ represents the calibration phase angle.

3. The measurement apparatus according to claim 2, wherein the controller is configured to calculate the resistance component leakage current based on a following equation (2):

$$Ior = Io \times \cos\theta \tag{2}$$

wherein, Ior represents the resistance component leakage current, and Io represents the leakage current.

4. The measurement apparatus according to claim 1, further comprising an input interface configured to be able to accept an operation from a user, wherein when the input interface accepts, from the user, the operation to start a calibration operation, the controller controls the signal generator to output the sinusoidal waves and detects the calibration phase angle.

5. The measurement apparatus according to claim 1, further comprising a display, wherein the controller is configured to control the display to display the calculated resistance component leakage current.

6. The measurement apparatus according to claim 1, wherein the signal generator is configured to output the sinusoidal waves at one or more frequencies different from a measurement target frequency of the resistance component leakage current, and the controller is configured to perform detection of the calibration phase angle and calculation of the resistance component leakage current simultaneously.

7. The measurement apparatus according to claim 6, wherein the signal generator is configured to output the sinusoidal waves at one frequency different from the measurement target frequency of the resistance component leakage current, and the controller is configured to calculate the calibration phase angle at the measurement target frequency of the resistance component leakage current, based on the calibration phase angle detected when the signal generator is outputting the sinusoidal waves at the one frequency different from the measurement target frequency of the resistance component leakage current.

8. The measurement apparatus according to claim 6, wherein the signal generator is configured to output the sinusoidal waves at two frequencies different from the measurement target frequency of the resistance component leakage current, and the controller is configured to calculate the calibration phase angle at the measurement target frequency of the resistance component leakage current, based on the calibration phase angle detected when the signal generator is outputting the sinusoidal waves at the two frequencies different from the measurement target frequency of the resistance component leakage current.

9. The measurement apparatus according to claim 8, wherein one of the two frequencies is higher than the measurement target frequency, and the other of the two frequencies is lower than the measurement target frequency.

10. A measurement method by a measurement apparatus configured to be able to measure a resistance component leakage current, the measurement apparatus including a magnetic core capable of being disposed so as to surround a wire, first and second coils wound around the magnetic core, a current measurement circuit connected to the first coil, the current measurement circuit configured to be able to measure a leakage current of the wire, a voltage measurement circuit configured to be able to measure a voltage of the wire, a phase angle detection circuit configured to be able to detect a phase angle between the leakage current and the voltage, and a signal generator configured to be able to output sinusoidal waves to the second coil and the phase angle detection circuit, the measurement method comprising:

detecting, by the phase angle detection circuit, a calibration phase angle between a current measured by the current measurement circuit when the signal generator is outputting the sinusoidal waves, and one of the sinusoidal waves input from the signal generator;

calculating a corrected phase angle based on the phase angle and the calibration phase angle; and calculating the resistance component leakage current based on the leakage current and the corrected phase angle.

* * * * *